United States Patent
Barrow et al.

(10) Patent No.: US 7,839,222 B2
(45) Date of Patent: Nov. 23, 2010

(54) SYSTEMS AND METHODS USING PROGRAMMABLE FIXED FREQUENCY DIGITALLY CONTROLLED OSCILLATORS FOR MULTIRATE LOW JITTER FREQUENCY SYNTHESIS

(75) Inventors: Shawn Barrow, Suwanee, GA (US); Kevin S. Beasley, Cumming, GA (US)

(73) Assignee: Ciena Corporation, Linthicum, MD (US)

( * ) Notice: Subject to any disclaimer, the term of this patent is extended or adjusted under 35 U.S.C. 154(b) by 148 days.

(21) Appl. No.: 12/177,314

(22) Filed: Jul. 22, 2008

(65) Prior Publication Data

US 2010/0019855 A1 Jan. 28, 2010

(51) Int. Cl.
*H03L 7/087* (2006.01)
(52) U.S. Cl. ............................. 331/25; 331/11; 331/14; 331/1 A; 327/5; 327/159
(58) Field of Classification Search .................. 331/25, 331/1 A, 10, 11, 14, 17; 327/3, 5, 7, 12, 327/18, 20, 156, 159; 375/376
See application file for complete search history.

(56) References Cited

U.S. PATENT DOCUMENTS 6,968,027 B2 * 11/2005 Fukuhara ..................... 375/376
7,126,429 B2 * 10/2006 Mitric ........................... 331/2

* cited by examiner

*Primary Examiner*—Robert Pascal
*Assistant Examiner*—Ryan Johnson
(74) *Attorney, Agent, or Firm*—Clements Bernard PLLC; Christopher L. Bernard; Tyler S. Brown (57) ABSTRACT

The disclosure provides systems and methods for programmable fixed frequency digitally controlled oscillators for multirate low jitter frequency synthesis. The present invention utilizes a digital control element, such as a complex programmable logic device (CPLD) or field programmable gate array (FPGA), to monitor the frequency offset of a DCO with respect to one or more timing module (TM) references. The frequency offset is measured by aligning the phase of a DCO feedback divider to the phase of a reference divider, and then counting the number of pulses in the DCO between the falling edges of the feedback to determine a frequency error. Falling edge detection is used to determine a sign of the error. The digital control element then calculates a frequency correction based on a linear scaling factor to send a new control word to the DCO to reduce the frequency error.

11 Claims, 9 Drawing Sheets

SYSTEMS AND METHODS USING PROGRAMMABLE FIXED FREQUENCY DIGITALLY CONTROLLED OSCILLATORS FOR MULTIRATE LOW JITTER FREQUENCY SYNTHESIS

FIELD OF THE INVENTION

The present invention relates generally to digitally controlled oscillators (DCOs). More specifically, the present invention provides systems and methods for programmable fixed frequency digitally controlled oscillators for multirate low jitter frequency synthesis.

BACKGROUND OF THE INVENTION

A numerically controlled oscillator (NCO) or digitally controlled oscillator (DCO) is an electronic system for synthesizing a range of frequencies from a fixed timebase. A frequency synthesizer is an electronic system for generating any of a range of frequencies from a single fixed timebase or oscillator. A crystal oscillator is an electronic circuit that uses the mechanical resonance of a vibrating crystal of piezoelectric material to create an electrical signal with a very precise frequency. This frequency is commonly used to keep track of time, to provide a stable clock signal for digital integrated circuits, to stabilize frequencies for transmitters/receivers, and the like.

Conventional systems and methods utilize either an analog voltage controlled crystal oscillators (VCXOs) in a phase-locked loop (PLL) or digitally controlled oscillators (DCOs) that include an analog to digital converter (ADC), so it can be used as replacement for an analog VCXO. This PLL is locked to the output from a timing module for system timing of transmitted data. Disadvantageously, both the VCXO and the DCO with ADC solutions require external analog filters (also known in the industry as deglitchers) in order to remove the instantaneous control signal from the oscillator, which requires a steady, noise-free, analog control voltage. This external filter adds cost, power, and potentially noise, as the control voltage is brought outside of the component.

Telecom and datacom systems are designed for multirate processing of various signals, such as, for example, OC-48, Optical Transport Unit level-1 (OTU-1), OC-192, Optical Transport Unit level-2 (OTU-2), Gigabit Ethernet, Fibre Channel, and the like. For multirate designs, multiple VCXOs are utilized with a multiplexer to engage the desired frequency, or a programmable DCO that includes an ADC, to act as VCXO replacement. Disadvantageously, the conventional systems and methods require multiple VCXOs or a DCO with an integrated ADC. Using multiple VCXOs requires a multiplexer, more printed circuit board area, and more power. Using a DCO with an integrated ADC is much higher cost. Furthermore, accurate and fast timing module (TM) failure detection is difficult, depending on the level of failure detection required.

BRIEF SUMMARY OF THE INVENTION

In various exemplary embodiments, the present invention provides systems and methods for programmable fixed frequency digitally controlled oscillators for multirate low jitter frequency synthesis. The present invention utilizes a digital control element, such as a complex programmable logic device (CPLD) or field programmable gate array (FPGA), to monitor the frequency offset of a DCO with respect to one or more timing module (TM) references. The frequency offset is measured by aligning the phase of a DCO feedback divider to the phase of a reference divider, and then counting the number of pulses in the DCO between the falling edges of the feedback to determine a frequency error. Falling edge detection is used to determine a sign of the error. The digital control element then calculates a frequency correction based on a linear scaling factor to send a new control word to the DCO to reduce the frequency error.

In an exemplary embodiment of the present invention, a system for multirate frequency synthesis includes a digitally controlled oscillator; a phase detector connected to a timing reference and an output of the digitally controlled oscillator, wherein the phase detector is configured to detect a timing reference failure, a magnitude of frequency error between the timing reference and the digitally controlled oscillator, and a sign of the frequency error between the timing reference and the digitally controlled oscillator; and digital control logic connected to the phase detector and the digitally controlled oscillator, wherein the digital control logic is configured to calculate a frequency correction responsive to the frequency error and to send the frequency correction to the digitally controlled oscillator. The timing reference can include a first timing reference; wherein the phase detector is further connected to a second timing reference including a redundant timing reference to the first timing reference; and wherein the phase detector is configured to detect a first timing reference failure, a second timing reference failure, a magnitude of frequency error between the first timing reference and the digitally controlled oscillator, a sign of the frequency error between the first timing reference and the digitally controlled oscillator, a magnitude of frequency error between the second timing reference and the digitally controlled oscillator, and a sign of the frequency error between the second timing reference and the digitally controlled oscillator. The digital control logic is configured to update the digitally controlled oscillator from the second timing reference responsive to the first timing reference failure. Optionally, the phase detector includes a first phase detector; wherein the system further includes a plurality of phase detectors connected to the timing reference and the output of the digitally controlled oscillator, wherein each of the plurality of phase detectors is configured to detect a timing reference failure, a magnitude of frequency error between the timing reference and the digitally controlled oscillator, and a sign of the frequency error between the timing reference and the digitally controlled oscillator; and the first phase detector and each of the plurality of phase detectors are configured for phase detection at different frequencies. The first phase detector and each of the plurality of phase detectors at higher detector frequencies are utilized for fast acquisition and timing module failure detection; and the first phase detector and each of the plurality of phase detectors at lower detector frequencies are utilized for longer integration times to allow fine tuning. The phase detector is configured to detect the magnitude of frequency error between the timing reference and the digitally controlled oscillator by aligning a phase of a digitally controlled oscillator feedback divider to a phase of a timing reference divider and counting a number of pulses in the digitally controlled oscillator between falling edges of the digitally controlled oscillator feedback divider; and the phase detector is configured to detect the sign of the frequency error between the timing reference and the digitally controlled oscillator utilizing falling edge detection. The phase detector can include a counter connected to the output of the digitally controlled oscillator; a logic AND gate including inputs from the digitally controlled oscillator feedback divider and the timing reference divider and an output to a clock on the counter, wherein the digitally controlled oscillator feedback divider is set to a zero phase on a rising edge of the timing reference divider; a latch including an input from the counter, an enable connected to an output of a logic NOR gate including inputs from the digitally controlled oscillator feedback divider and the timing reference divider; and a synchronous SR latch including the digitally controlled oscillator feedback divider connected to an S input, the timing reference divider connected to an R input, and an inverted output of the logic AND gate connected to an enable input.

In another exemplary embodiment of the present invention, a programmable, fixed-frequency digitally-controlled oscillator system includes a programmable oscillator including a controlled output frequency and a digital communications interface; a circuit connected to the digital communications interface; a first timing reference and a second timing reference, wherein each of the first timing reference and the second timing reference are input into the circuit; wherein the circuit is configured to control the programmable oscillator through the digital communications interface responsive to one of the first timing reference and the second timing reference. The circuit can include one of a complex programmable logic device and a field programmable gate array. The circuit includes a multiplexer connected to the first timing reference and the second timing reference and configured to output one of the first timing reference and the second timing reference responsive to a selector signal; a digital phase lock loop configured to multiply the output of the multiplexer up to a frequency desired for the programmable oscillator and to maintain a locked frequency relationship to which of the first timing reference and the second timing reference is output by the multiplexer; a pulse generator configured to output a pulse for a sampling period; a proportional differential calculation logic configured to perform an error calculation responsive to the pulse; and a state machine configured to control transmission of data words to the programmable oscillator responsive to the error calculation. The circuit can further include a reference failure detector, holdover, and switching logic configured to output the selector signal and to provide suspend input to the state machine. The state machine can include an IDLE state, a READ state, an UPDATE state, a WRITE state, and a DONE state; wherein the state machine enters the IDLE state upon power on or reset; wherein in the READ state, the circuit reads a frequency multiplication value from the programmable oscillator; wherein in the UPDATE state, the circuit performs the error calculation; wherein in the WRITE state, the circuit communicates the updated frequency multiplication value to the programmable oscillator; and wherein in the DONE state, the circuit stores the updated frequency multiplication value and transitions to the UPDATE state. The proportional differential calculation logic can include counter and synchronization logic implemented in the circuit to count positive clock and negative clock transitions from the one of the first timing reference and the second timing reference output by the multiplexer and the controlled output frequency. The proportional differential calculation logic can further include logic configured to perform a calculation responsive to counts from the counter and synchronization logic.

In yet another exemplary embodiment of the present invention, a method of multirate frequency synthesis with a programmable fixed frequency digitally controlled oscillator includes aligning a phase of a digitally controlled oscillator feedback divider to a phase of a timing reference divider; counting a number of pulses in the programmable fixed frequency digitally controlled oscillator between falling edges of the digitally controlled oscillator feedback divider; determining a magnitude of a frequency error between the programmable fixed frequency digitally controlled oscillator and a timing reference responsive to the number of pulses counted; utilizing falling edge detection to determine a sign of the frequency error; and calculating using a linear scaling factor a frequency correction for the programmable fixed frequency digitally controlled oscillator responsive to the magnitude of the frequency error and the sign of the frequency error. The method can further include updating the programmable fixed frequency digitally controlled oscillator with the frequency correction. Optionally, the method further includes detecting a failure in the timing reference, holding over responsive to detecting a failure in the timing reference, and utilizing a second timing reference to perform the aligning, counting, determining, utilizing, and calculating steps responsive to detecting the failure.

BRIEF DESCRIPTION OF THE DRAWINGS

The present invention is illustrated and described herein with reference to the various drawings, in which like reference numbers denote like method steps and/or system components, respectively, and in which.

DETAILED DESCRIPTION OF THE INVENTION

In various exemplary embodiments, the present invention provides systems and methods for programmable fixed frequency digitally controlled oscillators for multirate low jitter frequency synthesis. The present invention utilizes a digital control element, such as a complex programmable logic device (CPLD) or field programmable gate array (FPGA), to monitor the frequency offset of a DCO with respect to one or more timing module (TM) references (e.g., primary and secondary references). The frequency offset is measured by aligning the phase of a DCO feedback divider to the phase of a reference divider, and then counting the number of pulses in the DCO between the falling edges of the feedback to determine a frequency error. Failing edge detection is used to determine a sign of the error. The digital control element then calculates a frequency correction based on a linear scaling factor to send a new control word to the DCO to reduce the frequency error.

Since the DCOs are accurate within a narrowly specified range, overflow in the frequency error counters can indicate a timing module failure. In the case of timing module failure, the frequency update word can be generated from a redundant source, e.g. the secondary references. Therefore the reference error is ignored by the control mechanism. Multiple loops with various feedback detector frequencies can be easily implemented. Higher detector frequency loops can be used for fast acquisition and timing module failure detection. Lower detector frequency loops can be used for longer integration times to allow extremely fine tuning.

Advantageously, the present invention reduces the complexity of frequency synthesizer design by replacing analog filters with digital signal processing (DSP). Phase noise of the synthesized signal is reduced by not exposing oscillator control voltage to the outside of the component. For multirate systems as are common in telecom and datacom systems, multiple VCXOs can be replaced by a single DCO. The accuracy of the DCO can be used for TM failure detection. As the frequency error is stored in memory before DCO command updates are issued, a TM failure and switchover can be hitless. The error of the DCO with respect to one or more TMs is simultaneously monitored. Once one TM deviates suddenly from the other, or the frequency monitored from the TM has greater than the specified tolerance from the DCO, the TM fail can be determined. This alleviates the requirement for a separate high accuracy clock to achieve the same level of TM failure detection.

The present invention allows the use of a low cost programmable oscillator to generate a clock frequency of a desired rate and a Field Programmable Gate Array (FPGA) device to frequency-lock the output of the programmable oscillator to one of two redundant reference clock frequencies. For telecommunications/datacommunications applications, the intrinsic accuracy of an internal crystal in the programmable oscillator can be used to determine that a timing module is off frequency. Additionally, if one of the two redundant timing module fails, frequency output update commands from the FPGA to the programmable oscillator can be temporarily suspended, thus activating an immediate holdover condition without a significant frequency deviation of the programmable oscillator's output frequency.

Figure 1:
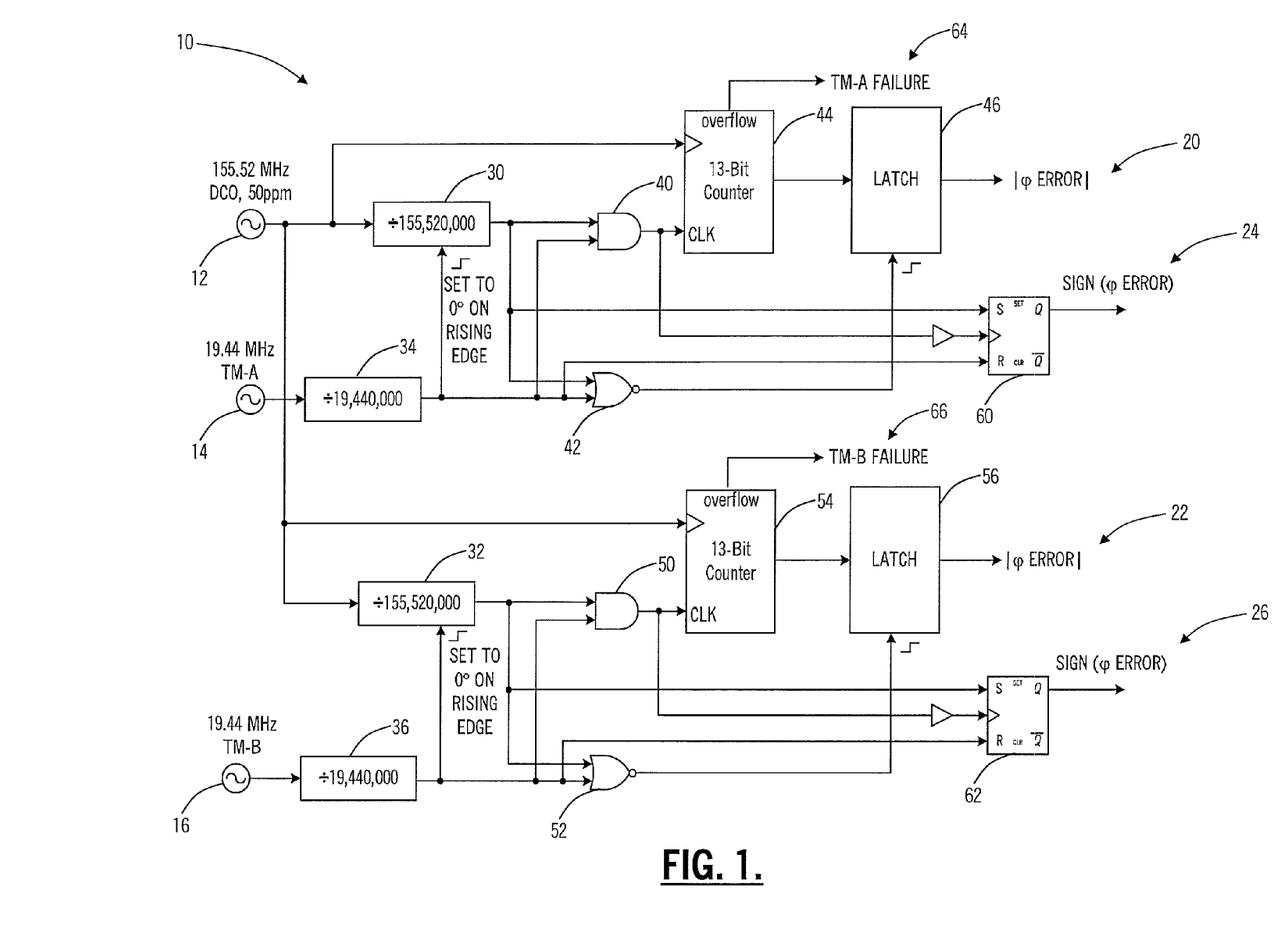
FIG. 1 is a 1 Hz phase ($\phi$) detector for a DCO and two timing references, TM-A and TM-B, according to an exemplary embodiment of the present invention.

Referring to FIG. 1, a 1 Hz phase ($\phi$) detector 10 for a DCO 12 and two timing references, TM-A 14 and TM-B 16, is illustrated according to an exemplary embodiment of the present invention. For example, the DCO 12 includes a frequency of 155.52 MHz with a 50 ppm resolution. The TM-A 14 and TM-B 16 include a frequency of 19.44 MHz. For example, the TM-A 14 and TM-B 16 can be redundant timing modules in a telecom or datacom system. Additionally, the phase ($\phi$) detector 10 can operate with only the TM-A 14, or with multiple TMs. Further, the TM-A 14 and TM-B 16 can each be a multirate device to accommodate various different signal rates as is required in telecom and datacom systems. The 1 Hz phase ($\phi$) detector 10 and the frequencies of the DCO 12, TM-A 14, and TM-B 16 are shown for illustration purposes, and those of ordinary skill in the art will recognize that other frequency phase detectors can be constructed similarly, such as 10 Hz, 1 mHz, and the like.

The phase ($\phi$) detector 10 is configured to detect a magnitude of phase error, |$\phi$ error| 20, 22, for each of the TM-A 14 and TM-B 16 with the DCO 12, and to detect a sign of the phase error 24, 26 for each of the TM-A 14 and TM-B 16 with the DCO 12. The DCO 12 is connected to frequency dividers 30, 32 set to divide the DCO 12 to 1 Hz. The TM-A 14 is connected to a frequency divider 34 and the TM-B 16 is connected to a frequency divider 36, and each frequency divider 34, 36 is configured to divide the TM-A 14 and TM-B 16 to 1 Hz. Note, the frequency dividers 30, 32, 34, 36 can be set arbitrarily to any integer value as required for the phase detection and the frequencies of the sources, DCO 12, TM-A 14, and TM-B 16. For multirate systems, the frequencies of the sources TM-A 14 and TM-B 16, can change over time to accommodate different signal rates, and accordingly, the frequency dividers 30, 32, 34, 36 can also be adjustable responsive to the source frequencies.

The |$\phi$ error| 20 between the TM-A 14 and the DCO 12 is measured utilizing an AND logic gate 40, a NOR logic gate 42, a 13-bit counter 44, and a latch 46. The |$\phi$ error| 22 between the TM-B 16 and the DCO 12 is measured utilizing an AND logic gate 50, a NOR logic gate 52, a 13-bit counter 54, and a latch 56. The sign of the phase error 24 is determined using the AND logic gate 40 and a synchronous SR latch 60. The sign of the phase error 26 is determined using the AND logic gate 50 and a synchronous SR latch 62.

The |$\phi$ error| 20 is measured by aligning the phase of the frequency divider 30, i.e. the DCO feedback divider, to the phase of the frequency divider 34, i.e. the TM-A reference divider. The frequency divider 30 is set to zero degrees phase on each rising edge of the frequency divider 34. Outputs from the frequency dividers 30, 34 are input to the AND logic gate 40, and the output of the AND logic gate 40 is utilized to clock the 13-bit counter 44 to count the number of pulses in the DCO 12 between the falling edges of the feedback. If there is an overflow from the 13-bit counter 44, a TM-A failure 64 signal is raised indicating a failure. The output of the 13-bit counter 44 is input into the latch 46 which is enabled through the output of the NOR logic gate 42. The NOR logic gate 42 is input with the outputs from the frequency dividers 30, 34.

The sign of the phase error 24 is determined by an output of the synchronous SR latch 60. The SR latch 60 includes the output from the frequency divider 30 for the S input, the from the frequency divider 34 for the R input, and is enabled by an inverted output from the AND logic gate 40. The sign of the phase error 24 is the Q output of the SR latch 60 which keeps the output state until the inverted output from the AND logic gate 40 enables the SR latch 60. This provides falling edge detection is used to determine the sign of the error.

The |$\phi$ error| 22 is measured by aligning the phase of the frequency divider 32, i.e. the DCO feedback divider, to the phase of the frequency divider 36, i.e. the TM-B reference divider. The frequency divider 32 is set to zero degrees phase on each rising edge of the frequency divider 36. Outputs from the frequency dividers 32, 36 are input to the AND logic gate 50, and the output of the AND logic gate 50 is utilized to clock the 13-bit counter 54 to count the number of pulses in the DCO 12 between the falling edges of the feedback. If there is an overflow from the 13-bit counter 54, a TM-B failure 66 signal is raised indicating a failure. The output of the 13-bit counter 54 is input into the latch 56 which is enabled through the output of the NOR logic gate 52. The NOR logic gate 52 is input with the outputs from the frequency dividers 32, 36.

The sign of the phase error 26 is determined by an output of the synchronous SR latch 62. The SR latch 62 includes the output from the frequency divider 32 for the S input, the from the frequency divider 36 for the R input, and is enabled by an inverted output from the AND logic gate 50. The sign of the phase error 26 is the Q output of the SR latch 62 which keeps the output state until the inverted output from the AND logic gate 50 enables the SR latch 62. This provides falling edge detection is used to determine the sign of the error.

Figure 2:
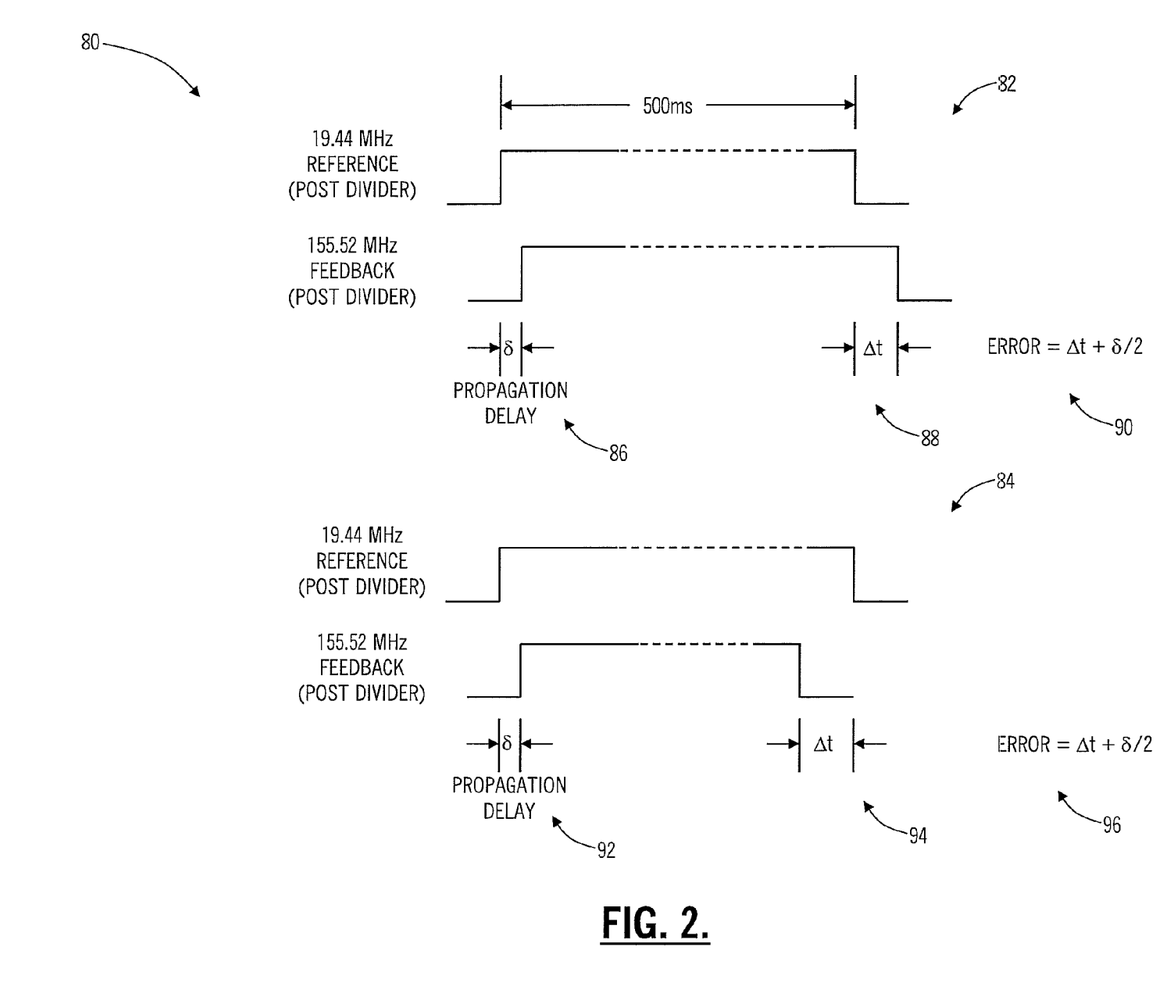
FIG. 2 is a timing diagram of error measurement utilizing the phase ($\phi$) detector of FIG. 1 according to an exemplary embodiment of the present invention.

Referring to FIG. 2, a timing diagram 80 illustrates error measurement utilizing the phase ($\phi$) detector 10 according to an exemplary embodiment of the present invention. The timing diagram 80 illustrates two exemplary time domain waveforms 82, 84 showing different signs for phase error. The time domain waveforms 82, 84 show the 19.44 MHz reference 12, 14 after the frequency divider 34, 36, and the 155.52 MHz DCO 12 feedback after the frequency divider 30, 32. The timing diagram 80 is shown with reference to the 1 Hz phase ($\phi$) detector 10 for illustration purposes, and those of ordinary skill in the art will recognize that other frequency phase detectors can be utilized similarly, such as 10 Hz, 1 mHz, and the like.

In the time domain waveform 82, there is a propagation delay $\delta$ 86 and a time difference $\Delta t$ 88 between the 19.44 MHz reference 12, 14 and the 155.52 MHz DCO 12 leading to an error 90 equal to $\Delta t$ 88 plus the propagation delay $\delta$ 86 divided by two. In the time domain waveform 82, there is a propagation delay $\delta$ 92 and a time difference $\Delta t$ 94 between the 19.44 MHz reference 12, 14 and the 155.52 MHz DCO 12 leading to an error 96 equal to $\Delta t$ 91 plus the propagation delay $\delta$ 92 divided by two. For example, the phase ($\phi$) detector 10 can be configured to count the pulses of the DCO 12 during the error 90, 92 periods to determine an error magnitude. Note, the error 90 has a different sign from the error 96 in the time domain waveforms 82, 84.

Figure 3:
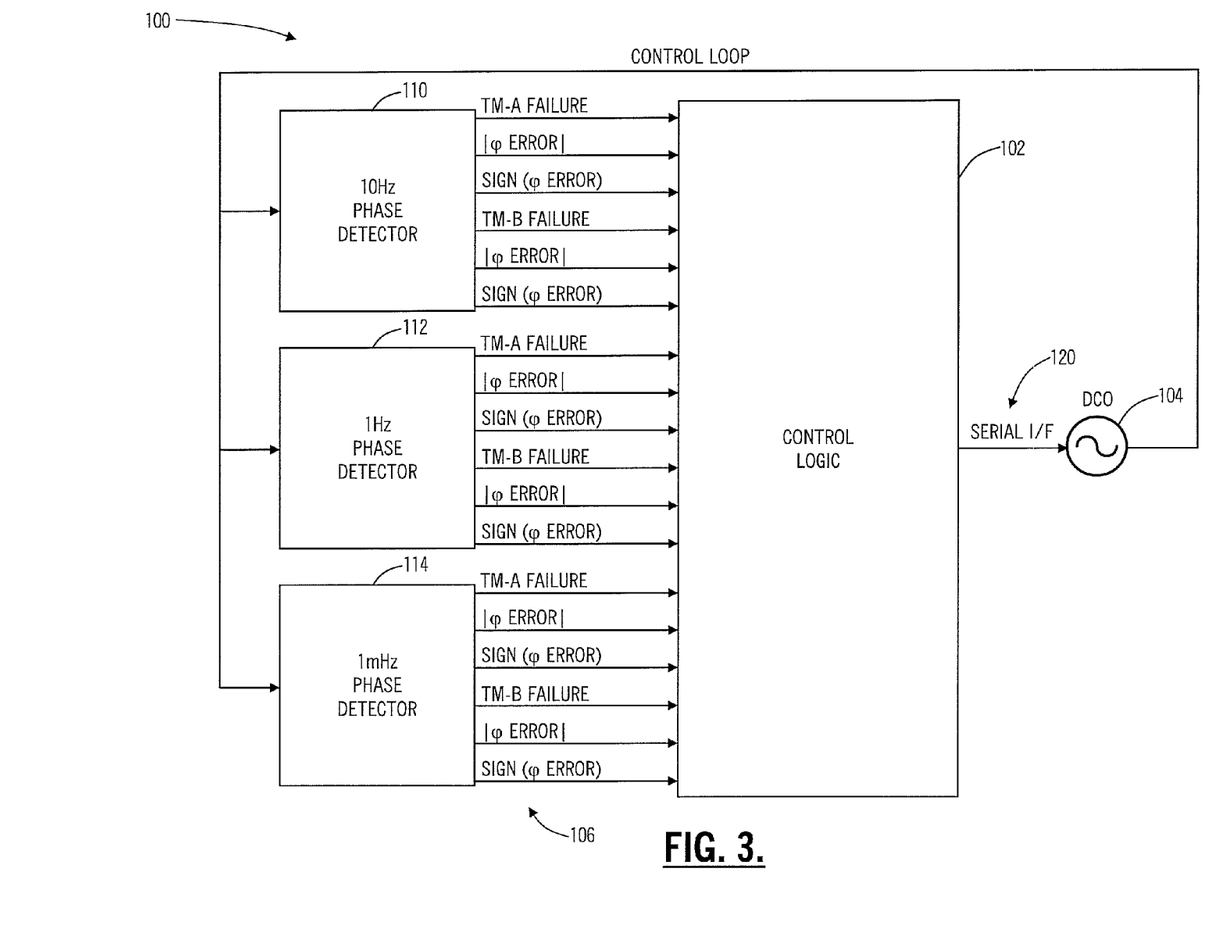
FIG. 3 is a block diagram of a DCO control system configured to monitor and adjust frequency offsets with respect to redundant timing modules, TM-A and TM-B, according to an exemplary embodiment of the present invention.

Referring to FIG. 3, a DCO control system 100 configured to monitor and adjust frequency offsets with respect to redundant timing modules, TM-A and TM-B, is illustrated according to an exemplary embodiment of the present invention. The DCO control system 100 utilizes digital control logic 102 as a digital control element to provide feedback to a DCO 104. For example, the digital control logic 102 can include a CPLD, FPGA, Application Specific Integrated Circuit (ASIC), or any other digital logic device as is known in the art.

The DCO 104 is a programmable fixed frequency digitally controlled oscillator (also known as a numerically controlled oscillator). The DCO 104 is capable of synthesizing a very wide range of precise frequency ratios based upon a digital input, i.e. a code word. The DCO control system 100 can be utilized with any type of DCO or the like to provide an updated digital input to correct the frequency. Alternatively, the DCO control system 100 could be utilized with a VCO or the like with the additional of a DAC on the output of the control logic 102.

The digital control logic 102 is configured to receive multiple inputs 106 from one or more phase detectors 110, 112, 114. In this exemplary embodiment, the digital control logic 102 receives inputs 106 from a 10 Hz phase detector 110, a 1 Hz phase detector 112, and a 1 mHz phase detector 114. For example, the 1 Hz phase detector 112 can be implemented as described in FIG. 1 for the phase ($\phi$) detector 10. Also, the 10 Hz phase detector 110 and the 1 mHz phase detector 114 can be constructed in a similar fashion.

Each phase detector 110, 112, 114 provides input signals to the digital control logic 102 for redundant timing modules, TM-A and TM-B. These signals include for each timing module a failure indicator, the magnitude of the phase error |$\phi$ error|, and the sign of the phase error (sign $\phi$ error). Note, the DCO control system 100 can include more than two timing modules as required for different applications, and can also include a single timing module.

Each of the phase detectors 110, 112, 114 is configured to monitor a frequency offset of the DCO 104 with respect to the redundant timing module references, TM-A and TM-V. The offset is measured by aligning the phase of a DCO feedback divider to the phase of the reference divider, and then counting the number of pulses in the DCO between the falling edges of the feedback. This determines the frequency error. Falling edge detection is used to determine the sign of the error. The inputs 106 include both the magnitude and the sign of the error.

The digital control logic 102 calculates a frequency correction based on a linear scaling factor from all of the inputs 106 to send a new control word to the DCO 104 to reduce the frequency error. The digital control logic 102 includes a serial interface 120 to provide the new control word to the DCO 104. In the case of timing module failure, the frequency update word can be generated from the redundant source. Therefore the reference error is ignored by the digital control logic 102. Multiple loops with various feedback detector frequencies can be easily implemented. As described herein, the different phase detectors 110, 112, 114 can be utilized for different applications. The higher detector frequency loops, e.g. the phase detectors 112, 114, can be used for fast acquisition and timing module failure detection. The lower detector frequency loops, e.g. the phase detectors 110, 112 can be used for longer integration times to allow extremely fine tuning.

In an exemplary embodiment, the DCO control system 100 can be integrated within timing modules in various telecom and datacom systems. The DCO control system 100 reduces both cost and board space by removing requirements for multiple oscillators to accommodate multirate signals. For example, the DCO control system 100 can be utilized in wave division multiplexed (WDM) systems which are configured to transport various different rate signals, such as SONET, Ethernet, Fibre Channel, OTN, and the like. The DCO control system 100 can also be utilized in optical cross connects (OXC), multi-service provisioning platforms (MSPP), routers/switches, and the like.

Figure 4:
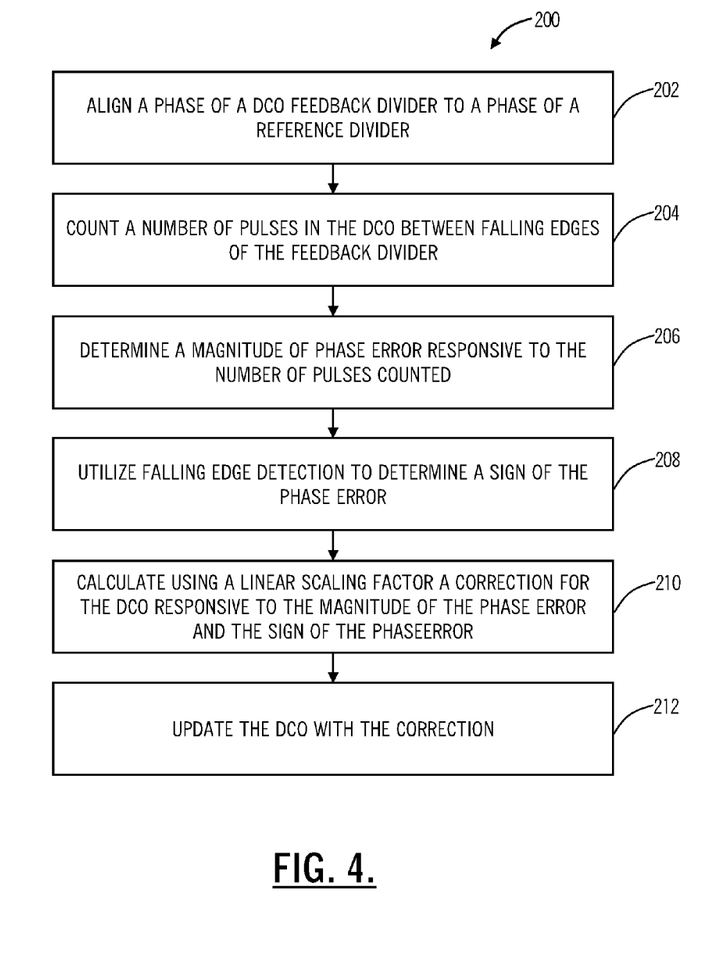
FIG. 4 is a flowchart of a mechanism for programming a fixed frequency DCO for multirate low jitter frequency synthesis according to an exemplary embodiment of the present invention.

Referring to FIG. 4, a flowchart illustrates a mechanism 200 for programming a fixed frequency DCO for multirate low jitter frequency synthesis according to an exemplary embodiment of the present invention. The mechanism 200 can be implemented for various different feedback detector frequencies, e.g. 1 mHz, 1 Hz, 10 Hz, etc. Further, the mechanism 200 can be implemented with one or more references for redundancy.

The phase of a DCO feedback divider is aligned to a phase of a reference divider (step 202). The number of pulses is counted in the DCO between falling edges of the feedback divider (step 204). The magnitude of phase error between the DCO and the reference is determined responsive to the number of pulses counted (step 206). Falling edge detection is utilized to determine a sign of the phase error (step 208). A correction for the DCO is calculated using a linear scaling factor responsive to the magnitude of the phase error and the sign of the phase (step 210). The DCO is updated with the calculated correction (step 212).

Figure 5:
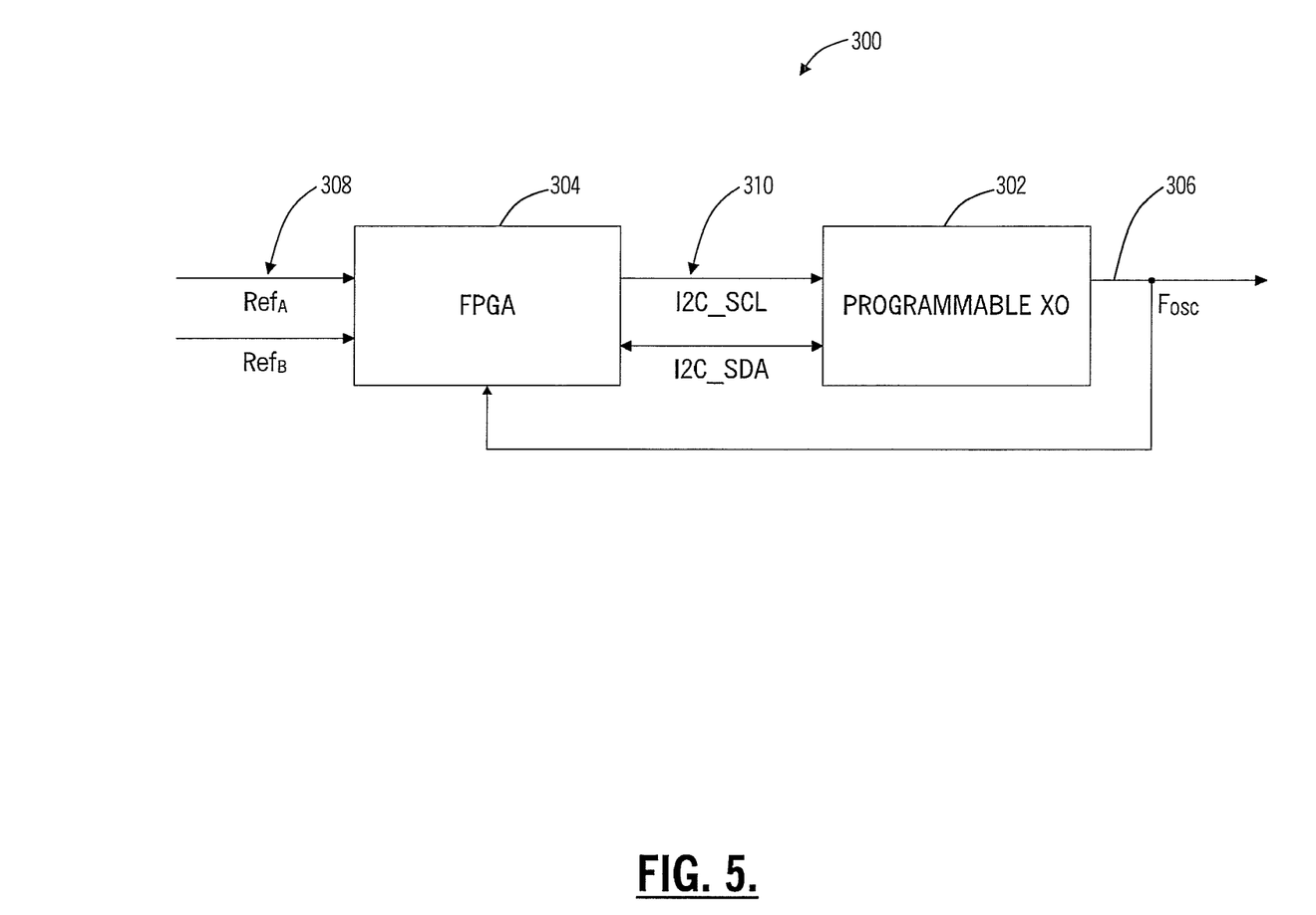
FIG. 5 is a block diagram of a programmable, fixed-frequency digitally-controlled oscillator according to an exemplary embodiment of the present invention.

Referring to FIG. 5, a programmable, fixed-frequency digitally-controlled oscillator 300 is illustrated according to an exemplary embodiment of the present invention. The programmable, fixed-frequency digitally-controlled oscillator 300 includes a programmable oscillator (XO) 302 which can generate a clock frequency of a desired rate and a FPGA 304 configured to frequency-lock an output ($F_{OSC}$) 306 of the programmable oscillator to one of two redundant reference clock frequencies ($Ref_A$, $Ref_B$) 308. The programmable oscillator (XO) 302 includes an internal fixed frequency crystal oscillator and a digital communications interface (I2C) 310 for communications with the FPGA 304. The redundant reference clock frequencies ($Ref_A$, $Ref_B$) 308 provide an external timing reference source as inputs to the FPGA 304 along with the output ($F_{OSC}$) 306. The I2C 310 includes clock and data signals between the FPGA 304 and the programmable oscillator 302 at an approximate data rate of 400 kbps.

Figure 6:
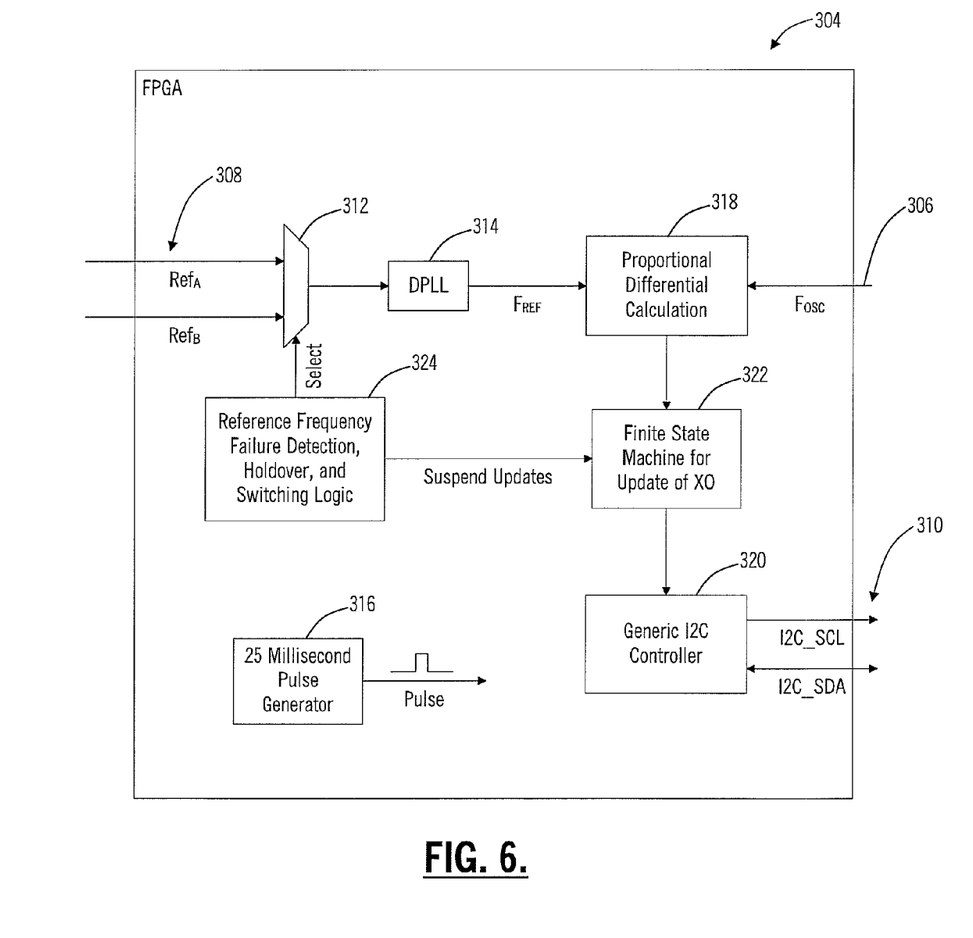
FIG. 6 is a block diagram of functionality of a field programmable gate array (FPGA) for controlling the output frequency of the digitally-controlled oscillator of FIG. 5 according to an exemplary embodiment of the present invention.

Referring to FIG. 6, functionality of the FPGA 304 is illustrated for controlling the output frequency of the programmable oscillator 302 according to an exemplary embodiment of the present invention. The FPGA 304 is utilized to implement the phase detector described herein. A multiplexer 312 selects one of the two redundant reference clocks 308 to be used as a timing reference. This timing reference is fed into a digital phase lock loop (DPLL) circuit 314 to multiply the timing reference up to a frequency desired for the programmable oscillator's output 306 frequency to match. The DPLL 314 maintains a locked frequency relationship to the select reference clock's frequency.

A 25 millisecond pulse generator 316 establishes a sampling period for the design, for example. At a rate of 40 times per second, an error calculation is performed through a proportional differential calculation 318 and an updated thirty-two bit frequency multiplication value is communicated from the FPGA 304 to the programmable oscillator 302 via the I2C interface 310 with a generic I2C controller 320. A finite state machine 322 controls the transmission of four 8-bit data words to the programmable oscillator. The combined communication time and settling period for the updated frequency multiplication value to take effect is 250 microseconds, or approximately 1% of the sampling period. Those of ordinary skill in the art will recognize different sampling periods and update frequencies are also contemplated by the present invention.

The FPGA 304 can include reference frequency failure detection, holdover, and switching logic 324. In the event that timing reference 308 fails, updates to the programmable oscillator 302 are suspended, creating a holdover condition that maintains the programmable oscillator's 302 output frequency with minimal deviation, and the redundant non-failed timing reference 308 is selected.

Figure 7:
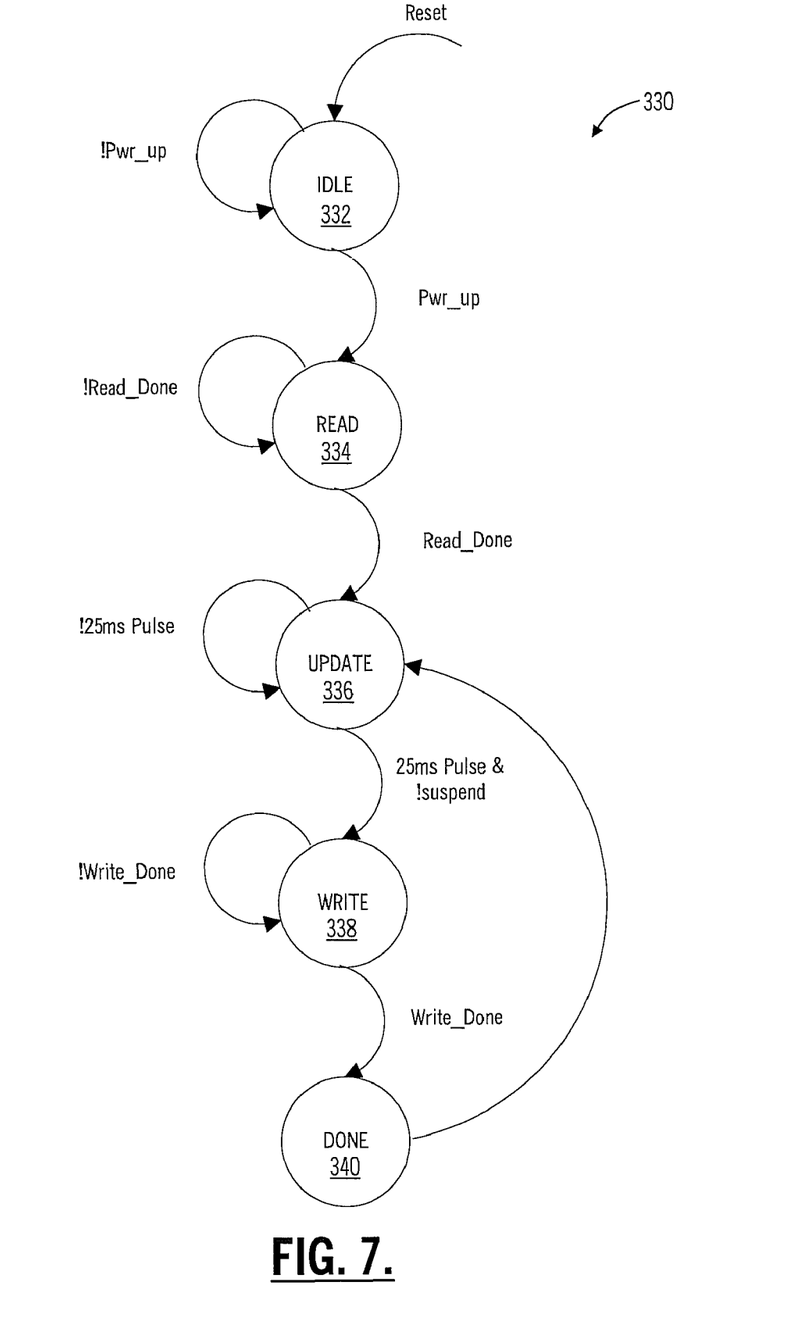
FIG. 7 is a finite state machine diagram for controlling updates to the digitally-controlled oscillator's 32-bit frequency multiplication value according to an exemplary embodiment of the present invention.

Referring to FIG. 7, a finite state machine 330 diagram is illustrated for controlling updates to the programmable oscillator's 302 32-bit frequency multiplication value according to an exemplary embodiment of the present invention. The finite state machine 330 diagram includes the following states: IDLE 332, READ 334, UPDATE 336, WRITE 338, and DONE 340. On power up and configuration of the FPGA 304, the state machine 340 enters the IDLE state 332. This state 332 is maintained for the duration of the power-up time required by the programmable oscillator 302. When this period expires, the READ state 334 is entered.

While in the READ state 334, an I2C read transaction is performed on the I2C 310. The FPGA 304 requests four 8-bit values from the programmable oscillator 302. The resulting 32 bit value is stored in the FPGA 304 as a baseline value for the programmable oscillator's 302 frequency multiplication value. When the I2C read operation is complete, the UPDATE state 336 is entered. The state machine 330 remains in this state until the 25 millisecond pulse has been detected based on the sampling period for the pulse generator 316. Once the 25 millisecond pulse has been detected, the WRITE state 338 is entered.

Logic in the FPGA 304 calculates an error value, and performs the computation of a correction value. This correction value is added to the stored frequency multiplication value obtained from the programmable oscillator during the READ state 334. This new updated frequency multiplication value is then communicated to the programmable oscillator 302 through four I2C write commands. Once the last write communication is finished, the state machine 330 enters the DONE state 340. In the DONE state 340, the updated frequency multiplication value is stored, and the FPGA 304 logic is readied for the next update. The next state transition is to the UPDATE state 336. The process repeats as long as a suspend command is not received from the timing reference failure detection logic 324.

Figure 8:
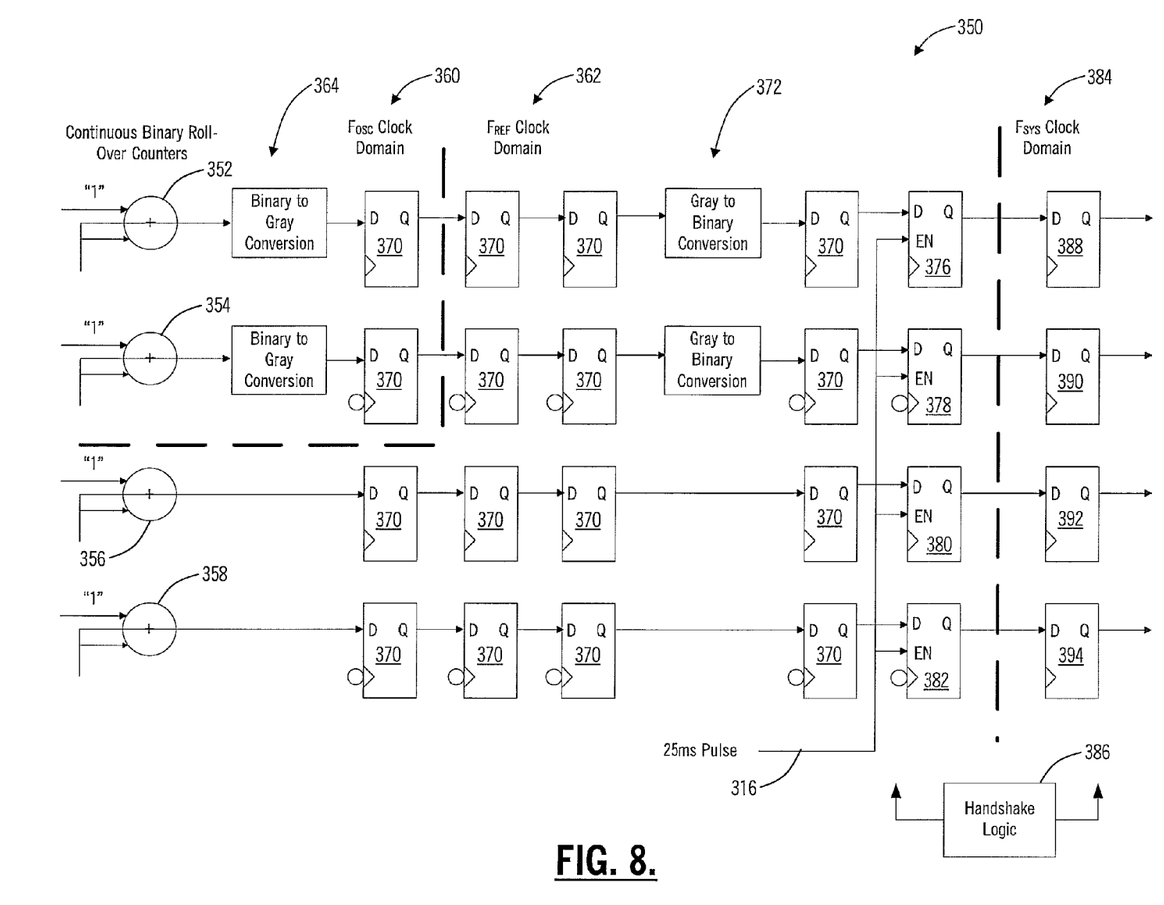
FIG. 8 is a diagram of counter and synchronization logic implemented in the FPGA of FIG. 6 according to an exemplary embodiment of the present invention.

Referring to FIG. 8, counter and synchronization logic 350 implemented in the FPGA 304 is illustrated according to an exemplary embodiment of the present invention. In this exemplary embodiment, four 32 bit counters 352, 354, 356, 358 are implemented, two of which operate in the frequency oscillator's clock domain 360 (bit counters 352, 354), and two which operate in the reference frequency's clock domain 362 (bit counters 356, 358). For each clock domain 360, 362, one of the counters 352, 354, 356, 358 is incremented on the positive edge of the clock, and the other is incremented on the negative edge of the clock. The size of these counters 352, 354, 356, 358 is not important, as they are continuously running and will roll-over to a zero value and continue to count. This effectively makes the counters 352, 354, 356, 358 infinite. It is the difference between the count values in the reference clock domain 362 and the programmable oscillator's clock domain 360 over the 25 millisecond sampling period that determine the error between the reference clock and the programmable oscillator's output clock.

As the counters 352, 354, 356, 358 continuously increment in both the oscillator's clock domain 360 and the reference clock's domain 362, a binary-to-gray code conversion 364 of the programmable oscillator's count values from counters 352, 354 is performed. The binary to gray conversion 364 ensures that only one bit of the registered count 352, 354 value is changing on every clock period. These count 352, 354 values are then synchronized to the reference clock domain 362 through multiple flip flops 370. A gray-to-binary conversion 372 is then performed on the count values. Pipeline registers for the reference clock domain's counters are implemented to match the latency of the synchronized counter values.

Every 25 milliseconds, a pulse 316 enables flip flops 376, 378, 380, 382 which latch all four of the count values 352, 354, 356, 358. These count values 352, 354, 356, 358 are synchronized to a slower system frequency clock domain 384 through handshaking logic 386, and stored in flip flops 388, 390, 392, 394. The slower system frequency clock domain 384 is where the error calculation and updated frequency multiplication value is computed. This is also the clock domain 384 where the finite state machine and I2C logic.

Figure 9:
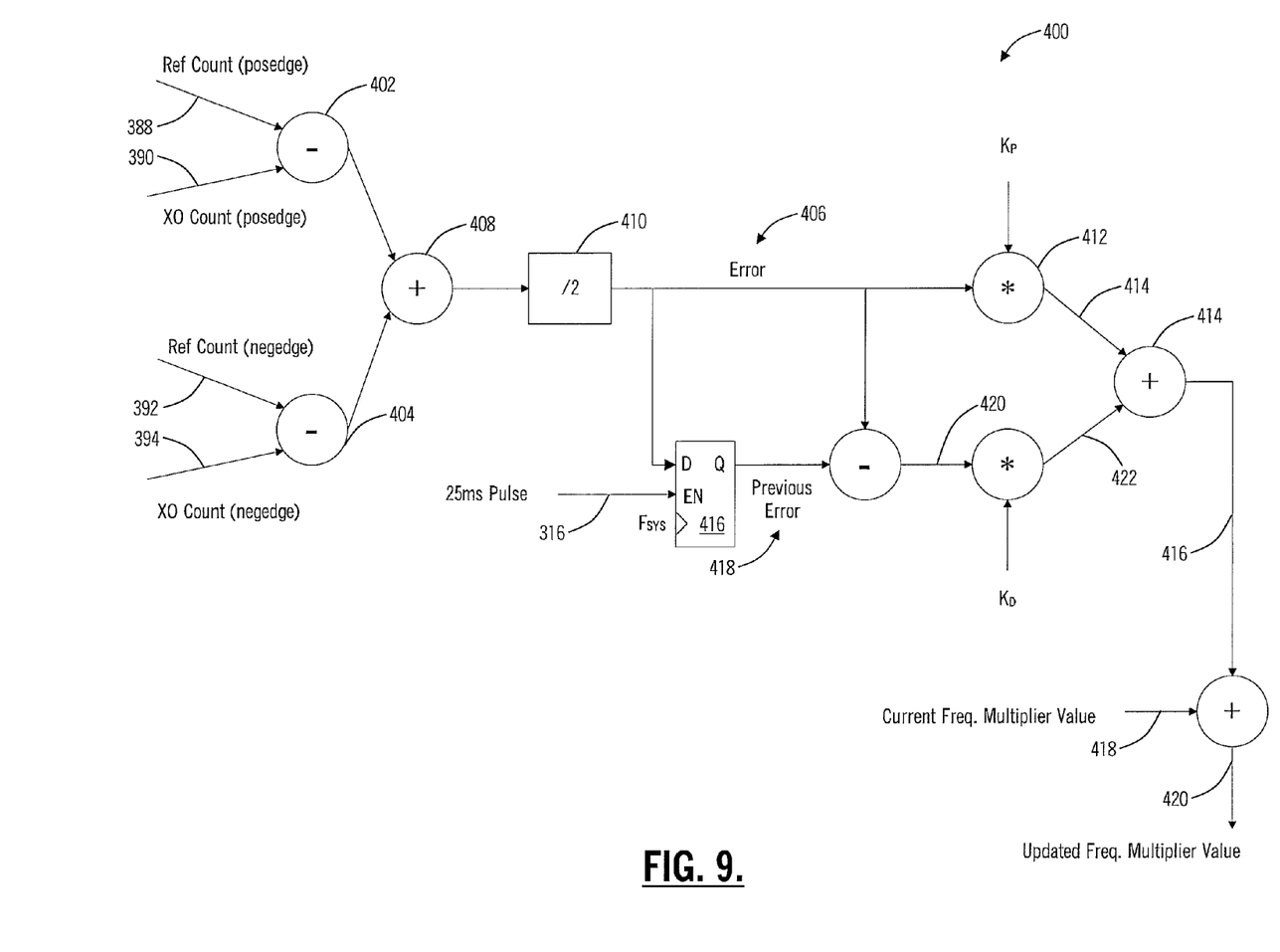
FIG. 9 is a diagram of an error calculation and frequency multiplier showing the corresponding steps performed on the count values in the flip flops from FIG. 8.

Referring to FIG. 9, an error calculation and frequency multiplier 400 is illustrated showing the corresponding steps performed on the count values 352, 354, 356, 358. The latched count value that is incremented on the positive edge of the programmable oscillator's clock (count value 352 from flip flop 388) is subtracted 402 from the latched count value that is incremented on the positive edge of the reference clock (count value 354 from flip flop 390). Similarly, the latched count value that is incremented on the negative edge of the programmable oscillator's clock (count value 356 from flip flop 392) is subtracted 404 from the latched count value that is incremented on the negative edge of the reference clock (count value 358 from flip flop 394). The result of these two difference calculations are averaged to arrive at an error value 406 through an addition 408 and division by two 410.

The error calculation and frequency multiplier 400 can utilize proportional (PD) control. The error value 406 is multiplied 412 by a proportional scaling factor $K_P$ 414, to arrive at a proportional component 414 of the correction. Every 25 milliseconds corresponding to the pulse 316, the error value 406 is stored in a register 416. An error value 418 calculated from the previous sampling period is subtracted from the error value 406 calculated during the current sampling period. This value 420 is multiplied by a differential scaling factor $K_D$, to arrive at a differential component 422 of the correction.

The proportional and differential components 414, 422 are added together, to arrive at a final correction value 416. This correction value 416 is added to a current frequency multiplier value 418, to arrive at a new frequency multiplier value 420 to correct the error detected between the reference clock's frequency and the programmable oscillator's output frequency. The new frequency multiplier value 420 is communicated to the programmable oscillator 302 via the I2C interface 310.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention and are intended to be covered by the following claims.

What is claimed is:

1. A system for multirate frequency synthesis, comprising:
  a digitally controlled oscillator;
  a plurality of phase detectors connected to a timing reference and an output of the digitally controlled oscillator, wherein each of the plurality of phase detectors is configured to detect a timing reference failure, a magnitude of phase error between the timing reference and the digitally controlled oscillator, and a sign of the phase error between the timing reference and the digitally controlled oscillator, and wherein each of the plurality of phase detectors is configured for phase detection at different frequencies; and
  digital control logic connected to the phase detector and the digitally controlled oscillator, wherein the digital control logic is configured to calculate a correction responsive to the phase error and to send the correction to the digitally controlled oscillator.

2. The system of claim 1, wherein the timing reference comprises a first timing reference;
  wherein each of the plurality of phase detectors is further connected to a second timing reference comprising a redundant timing reference to the first timing reference; and
  wherein each of the plurality of phase detectors is configured to detect a first timing reference failure, a second timing reference failure, a magnitude of phase error between the first timing reference and the digitally controlled oscillator, a sign of the phase error between the first timing reference and the digitally controlled oscillator, a magnitude of phase error between the second timing reference and the digitally controlled oscillator, and a sign of the phase error between the second timing reference and the digitally controlled oscillator.

3. The system of claim 1, wherein the digital control logic is configured to update the digitally controlled oscillator from the second timing reference responsive to the first timing reference failure.

4. The system of claim 3, wherein each of the plurality of phase detectors at higher detector frequencies are utilized for fast acquisition and timing module failure detection; and wherein each of the plurality of phase detectors at lower detector frequencies are utilized for longer integration times to allow fine tuning.

5. The system of claim 1, wherein each of the plurality of phase detectors is configured to detect the magnitude of phase error between the timing reference and the digitally controlled oscillator by aligning a phase of a digitally controlled oscillator feedback divider to a phase of a timing reference divider and counting a number of pulses of the digitally controlled oscillator between falling edges of the digitally controlled oscillator feedback divider; and
  wherein each of the plurality of phase detectors is configured to detect the sign of the phase error between the timing reference and the digitally controlled oscillator utilizing falling edge detection.

6. The system of claim 5, wherein each of the plurality of phase detectors comprises:
  a counter connected to the output of the digitally controlled oscillator;
  a logic AND gate comprising inputs from the digitally controlled oscillator feedback divider and the timing reference divider and an output to a clock on the counter, wherein the digitally controlled oscillator feedback divider is set to a zero phase on a rising edge of the timing reference divider;
  a latch comprising an input from the counter, an enable connected to an output of a logic NOR gate comprising inputs from the digitally controlled oscillator feedback divider and the timing reference divider; and
  a synchronous SR latch comprising the digitally controlled oscillator feedback divider connected to an S input, the timing reference divider connected to an R input, and an inverted output of the logic AND gate connected to an enable input.

7. A method of multirate frequency synthesis with a digitally controlled oscillator, comprising:
  aligning a phase of a digitally controlled oscillator feedback divider to a phase of a timing reference divider;
  counting a number of pulses of the digitally controlled oscillator between falling edges of the digitally controlled oscillator feedback divider;
  determining a magnitude of a phase error between the digitally controlled oscillator and a timing reference responsive to the number of pulses counted;
  utilizing falling edge detection to determine a sign of the phase error; and
  calculating using a linear scaling factor a correction for the digitally controlled oscillator responsive to the magnitude of the phase error and the sign of the phase error.

8. The method of claim 7, further comprising:
  updating the digitally controlled oscillator with the frequency correction.

9. The method of claim 7, further comprising:
  detecting a failure in the timing reference.

10. The method of claim 9, further comprising:
  holding over responsive to detecting a failure in the timing reference.

11. The method of claim 10, further comprising:
  utilizing a second timing reference to perform the aligning, counting, determining, utilizing, and calculating steps responsive to detecting the failure.

* * * * *